United States Patent
Sorin et al.

[11] Patent Number: 6,091,744
[45] Date of Patent: Jul. 18, 2000

[54] WAVELENGTH SELECTABLE SOURCE FOR WAVELENGTH DIVISION MULTIPLEXED APPLICATIONS

[75] Inventors: Wayne V. Sorin, Mountain View; Douglas M. Baney, Los Altos, both of Calif.

[73] Assignee: Hewlett-Packard Company, Palo Alto, Calif.

[21] Appl. No.: 09/006,756

[22] Filed: Jan. 14, 1998

[51] Int. Cl.[7] .................................................. H01S 3/10
[52] U.S. Cl. ................................................ 372/20; 372/19
[58] Field of Search ................................. 372/19, 20, 32, 372/102

[56] References Cited

U.S. PATENT DOCUMENTS

| | | | |
|---|---|---|---|
| 4,914,665 | 4/1990 | Sorin | 372/20 |
| 4,995,028 | 2/1991 | Alferness et al. | 372/20 |
| 5,581,572 | 12/1996 | Delorme et al. | 372/20 |
| 5,715,265 | 2/1998 | Epworth | 372/32 |
| 5,828,681 | 10/1998 | Epworth | 372/19 |
| 5,838,714 | 11/1998 | Delorme | 372/20 |
| 5,894,492 | 4/1999 | Welch et al. | 372/20 |

*Primary Examiner*—James W. Davie
*Assistant Examiner*—Robert E. Wise

[57] ABSTRACT

A broadband wavelength-selectable laser includes a gain medium, an optical transmission filter, and an optical fiber with a reflective filter such as a series of fiber Bragg gratings (FBGs). The gain medium is preferably a semiconductor laser diode that generates broadband optical energy. The gain medium is optically connected to the optical transmission filter, such as a bandpass filter, a notch filter, or a periodic filter, which converts the broadband optical energy into filtered optical energy having wavelength bands of high transmissivity and wavelength bands of low transmissivity. The optical transmission filter is optically connected to the series of FBGs that reflects different wavelength bands of optical energy. Either the optical transmission filter or the FBGs are tunable over a wavelength range that includes the desired laser wavelengths. Tuning a laser to a selected wavelength requires tuning either the optical transmission filter or the FBG that corresponds to the desired wavelength so that the selected wavelength of optical energy is reflected back toward the gain medium, thereby inducing lasing at the selected wavelength. The single wavelength laser light is suitable for wavelength division multiplexed applications.

10 Claims, 7 Drawing Sheets

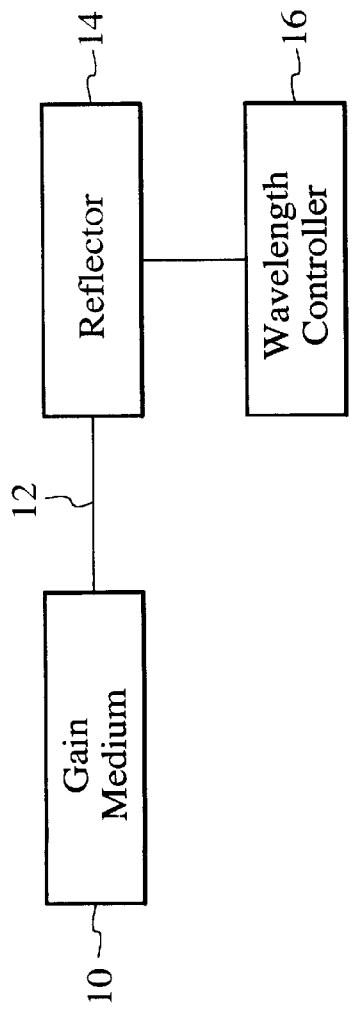
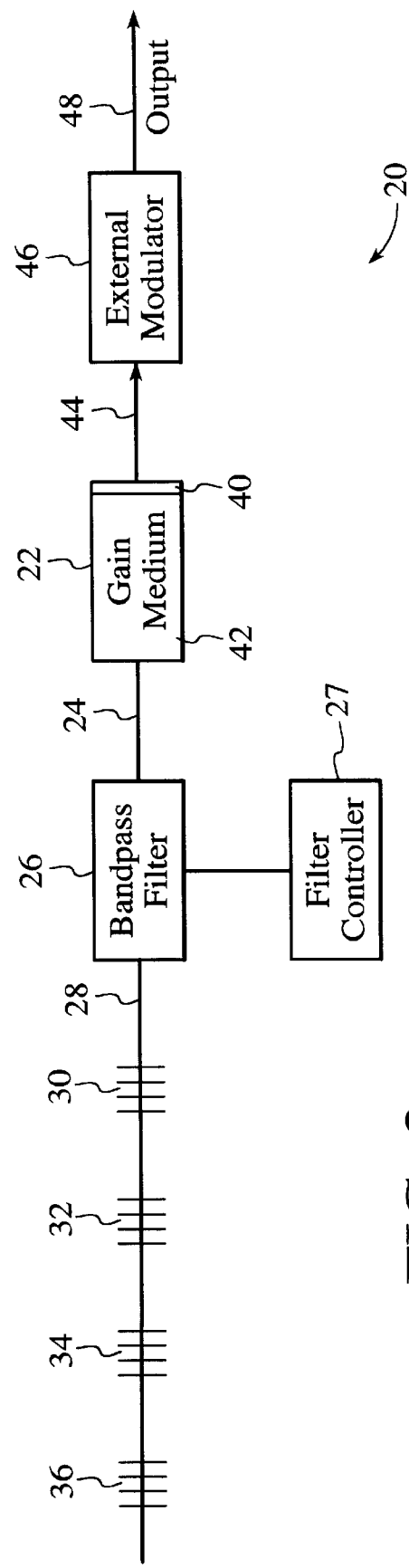
FIG. 1 (PRIOR ART)
FIG. 2

WAVELENGTH SELECTABLE SOURCE FOR WAVELENGTH DIVISION MULTIPLEXED APPLICATIONS

TECHNICAL FIELD

The present invention relates generally to lasers, and more particularly to wavelength selectable lasers.

BACKGROUND ART

Lasers generate optical energy over a broad bandwidth and are capable of lasing at a variety of different wavelengths. For example, the gain medium of an infrared semiconductor laser can emit optical energy within the infrared spectrum that consists of approximately 50 nanometers (nm). In applications requiring laser emissions at a single specified wavelength within the available spectrum, such as in wavelength division multiplexed applications, it is necessary to tune or fix the laser wavelength.

Tuning a laser can be accomplished by filtering the broad bandwidth optical energy generated by a gain medium to isolate a desired wavelength band and directing the isolated wavelength band into a laser cavity. Introducing the desired wavelength band into the laser cavity causes the optical energy to oscillate within the laser cavity at the desired wavelength. The oscillating optical energy is released from the laser cavity as laser light at the desired wavelength. Consequently, the tuning of a laser can be accomplished by controlling the wavelength of optical energy that is fed back into the laser cavity.

Two examples of wavelength-selectable lasers are disclosed in U.S. Pat. No. 4,914,665 to Sorin, which is assigned to the assignee of the present invention, and U.S. Pat. No. 4,955,028 to Alferness et al. (hereinafter Alferness). Referring to FIG. 1, the wavelength-selectable laser has a gain medium 10 which transmits optical energy through an optical fiber 12 to a single external reflector 14, such as a grating. The optical energy in the optical fiber contacts the lone external grating through an exposed region of the optical fiber and is reflected back to the gain medium to generate lasing at the desired wavelength band. The wavelength band of optical energy that the grating reflects back to the gain medium is dependent upon the spacing and orientation of grating ridges. In both Sorin and Alferness, the spacing and orientation of grating ridges are adjusted by hand through mechanical wavelength controller 16 that includes bulky metal frames and adjustment screws.

As an alternative to using an external grating in a wavelength-selectable laser, fiber Bragg gratings can be used to reflect a desired wavelength band of optical energy. A tunable fiber Bragg grating is a thermally or mechanically adjusted grating that is formed completely inside an optical fiber. Wavelength-selectable lasers are known in which a single fiber Bragg grating is substituted for the external grating employed in the Sorin and Alferness lasers. The main disadvantage of a wavelength-selectable laser employing a single fiber Bragg grating is that the fiber Bragg grating is adjustable only over a limited range of wavelengths. For example, a typical fiber Bragg grating can only be temperature tuned over a wavelength range of approximately 0.8 nm, limiting the adjustability of a laser to the same wavelength range.

In lightwave communication systems, lasers are often used as the optical energy source for carrying optical signals. Optical channels recognized by the International Telecommunications Union span a wavelength range of 30 nm. A wavelength-selectable laser that is adjustable only over a range of 0.8 nm does not provide optimal flexibility in many wavelength division multiplexed applications.

Adding additional fiber Bragg gratings into the optical fiber of a laser system provides a wider range of wavelength adjustability in a laser. A disadvantage of adding additional fiber Bragg gratings is that a fiber Bragg grating constantly reflects optical energy at some wavelength band. Since the gain medium of a laser system generates broadband optical energy, each additional fiber Bragg grating will reflect a wavelength band of optical energy back to the gain medium, causing interference and preventing the laser from lasing at a single wavelength in a stable manner.

What is needed is a wavelength-selectable laser that offers the advantages provided by fiber Bragg gratings, while allowing wavelength adjustability over a wavelength range that is practical for use, particularly in wavelength division multiplexed applications such as lightwave communications.

SUMMARY OF THE INVENTION

The invention is a method and system that allow single wavelength laser light emissions to be dynamically adjusted over a wide range of wavelengths by first filtering broadband optical emissions into optical energy having at least one wavelength band of high transmission and at least one wavelength band of low transmission and then selectively reflecting a desired narrow wavelength band of the high transmission optical energy back into a laser cavity, thereby causing the laser to lase at the desired narrow wavelength band. The elements of the wavelength-selectable laser system include an optical transmission filter that is optically connected to a gain medium and a reflective filter that is optically connected to the transmission filter.

In the preferred embodiment of the wavelength-selectable laser system, the gain medium is a semiconductor diode that generates broadband optical energy sufficient to create laser light. The gain medium is optically connected to a tunable bandpass filter that is able to transform the broadband optical energy generated by the gain medium into optical energy having a single wavelength band of high transmission. The bandpass filter is tunable such that the single wavelength band of high transmission can be adjusted. The tunable bandpass filter is optically connected to a series of FBGs that reflects optical energy at different narrow wavelength bands within the broad bandwidth of the optical energy generated by the gain medium. Each FBG is fixed to reflect optical energy at a specific wavelength that typically corresponds to a desired channel of the International Telecommunications Union (ITU) grid.

To emit laser light at a selected wavelength with the preferred system, broadband optical energy generated at the gain medium is transmitted through an optical fiber to the tunable bandpass filter, which transforms the broadband optical energy into filtered optical energy having a single wavelength band of high transmission. The filtered optical energy is then transmitted through a second optical fiber that contains the series of tunable FBGs. If the wavelength band of high transmission does not correspond to an optical energy wavelength band that is reflected by one of the FBGs, then no optical energy is reflected to the gain medium. To reflect a selected wavelength band of optical energy, the bandpass filter is tuned so that the wavelength band of high transmission corresponds to a wavelength band that is reflected by an FBG. Reflected optical energy travels back through the bandpass filter and into the gain medium, where the optical energy is incident to a partially reflective mirror.

Between the partially reflective mirror and the reflecting FBG, a laser cavity is created with the selected wavelength of optical energy significantly influencing optical energy being input by the gain medium, such that the combined optical cavity begins to lase at the selected wavelength. Laser light at the selected wavelength is emitted from the laser cavity through the partially reflective mirror, enabling the laser light to be used in wavelength division multiplexed applications, such as lightwave communications.

The wavelength-selectable laser system can be adjusted to emit laser light at different wavelengths by tuning the bandpass filter to pass optical energy that corresponds to an FBG that reflects optical energy at the selected wavelength. When the laser system is used in lightwave communications systems, the bandpass filter is tunable over a wavelength range that corresponds to the reflective wavelengths of the FBGs and the reflective wavelengths of the FBGs are fixed on the channels of the International Telecommunications Union (ITU) grid. By tuning the bandpass filter onto the reflective wavelength of an FBG, an ITU conforming signal can be quickly and reliably generated.

In alternative embodiments, other types of optical transmission filters, such as notch filters, can be used in a system similar to the bandpass filter system. In another alternative embodiment, a fixed periodic transmission filter and a tunable reflective grating can be used to achieve a similar result.

In an alternative configuration of the invention, a wavelength-selectable laser can have a ring cavity configuration. The ring cavity laser has an optical fiber loop coupled to both the output and the input of a gain medium. Intersecting the optical fiber loop is a three-port circulator that has two ports coupled to the optical fiber loop and one port optically connected to a periodic filter and a series of tunable FBGs. The gain medium generates broadband optical energy that is transmitted through the optical fiber loop and into the circulator, where the broadband optical energy contacts the optical transmission filter. When a periodic filter system is used, the periodic filter transforms the broadband optical energy into periodic optical energy and transmits the periodic optical energy to the series of FBGs. When one of the FBGs is tuned to a selected transmission peak, optical energy of the desired wavelength is reflected back through the circulator and into the optical fiber loop, causing the optical energy in the ring cavity to lase at the selected wavelength.

An advantage of the invention is that a laser can be accurately and reliably tuned over a wider range of wavelengths than would be possible if only one FBG were used to reflect optical energy into the laser cavity. In addition, the periodic filtering of broadband optical energy allows a laser to be tuned by any one of a series of FBGs with minimal interference. Moreover, the invention allows a laser to be easily tuned to the standard channels of the ITU grid and used in wavelength division multiplexed applications.

BRIEF DESCRIPTION OF THE DRAWINGS

FIG. 1 is a depiction of a prior art wavelength tunable laser with only one reflector.

FIG. 2 is a schematic view of a wavelength-selectable linear cavity laser utilizing a tunable bandpass filter in accordance with the present invention.

DETAILED DESCRIPTION

Figure 3:
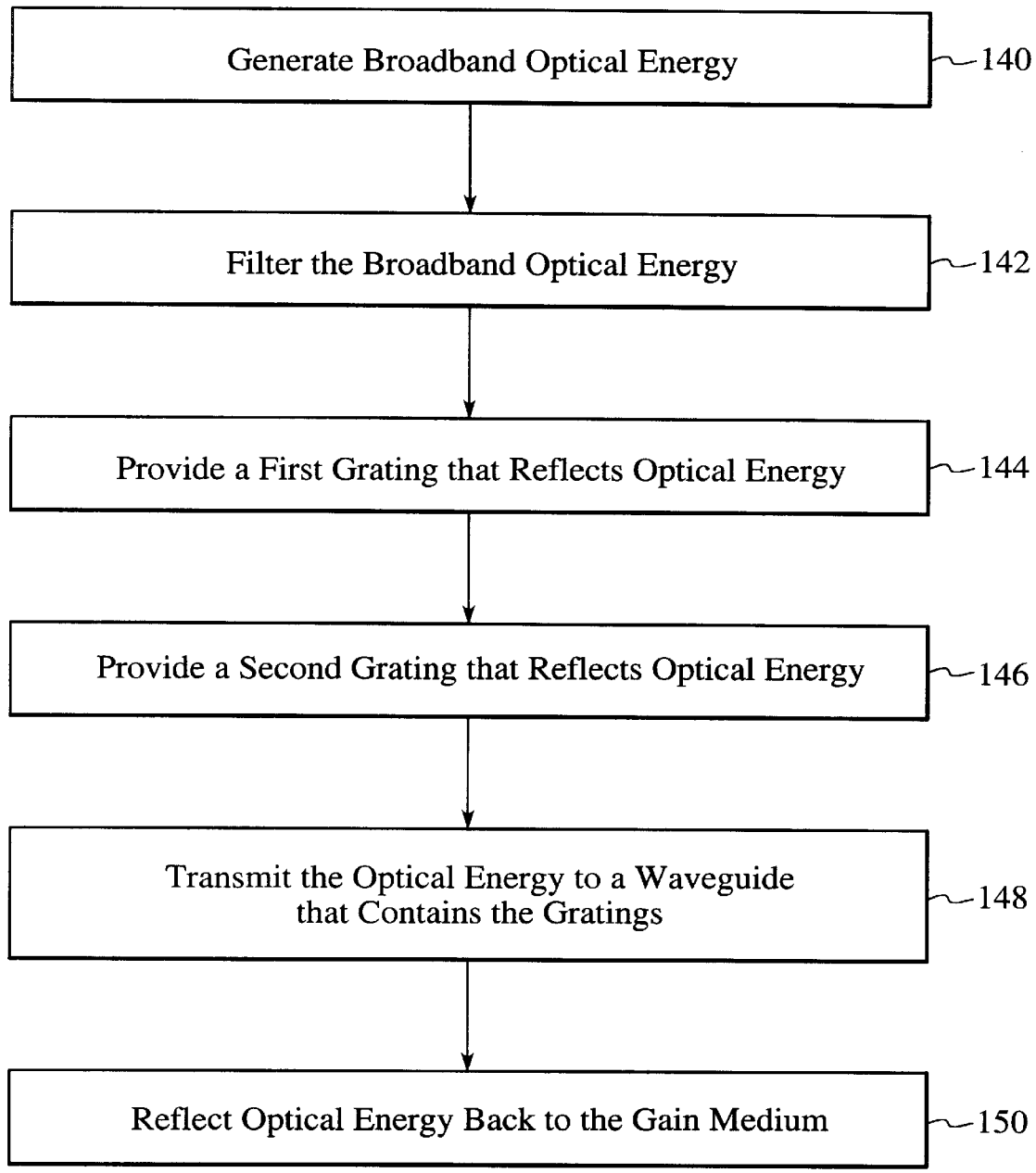
FIG. 3 is a process flow of steps for tuning a wavelength-selectable laser in accordance with the invention.

With reference to FIG. 2, the preferred embodiment of a wavelength-selectable laser system 20 includes a gain medium 22, a tunable bandpass filter 26, single mode optical fibers 24, 28 and 44, and a series of fiber Bragg gratings 30, 32, 34 and 36. The gain medium 22 is a conventional gain medium such as a semiconductor diode having a partially reflective mirror 40 at one surface and an antireflection coating at an opposite surface 42. Other acceptable gain mediums include amplifying fibers, such as an erbium doped optical fiber, although the type of gain medium is not critical to the invention.

Once generated, laser light is output through the partially reflective mirror 40 in accordance with the reflectivity of the mirror. For example, in the preferred embodiment the mirror reflects 30% of the optical energy that contacts the mirror while passing 70% to the output optical fiber 44. While 30% reflection is desired for the preferred embodiment, the reflectivity of the mirror can be varied.

A single mode optical fiber 24 with antireflection coatings at its ends is coupled to the gain medium 22 at surface 42. The antireflection coatings on surface 42 of the gain medium and the facing end of the optical fiber 24 reduce the possibility of unwanted internal reflections within the laser cavity, thereby promoting efficient optical coupling. As an alternative to antireflection coatings, angled end faces may be used to reduce unwanted reflections.

Figure 4:
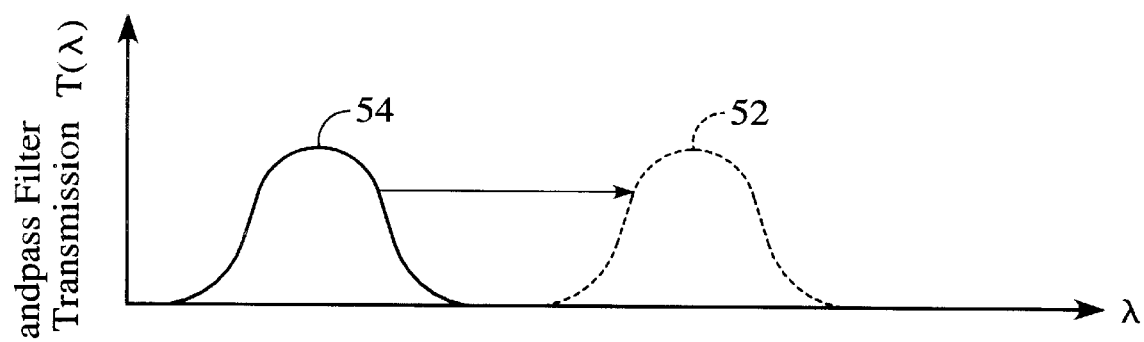
FIG. 4 illustrates filtered optical energy at a single wavelength band generated from the bandpass filter of FIG. 2.

The opposite end of the optical fiber 24 is coupled to a tunable bandpass filter 26 that has a non-reflecting input and a non-reflecting output. Examples of such filters are angle tuned dielectric filter stacks or acousto-optically tunable filters. Connected to the tunable bandpass filter is a filter controller 27 that allows tuning of the bandpass filter. The purpose of the tunable bandpass filter is to transform the broadband optical energy that is generated by the gain medium 22 into optical energy centered at a desired wavelength. Referring to FIG. 4, filtered broadband optical energy has a wavelength band 54 that passes through the bandpass filter. The optical energy that is not passed by the filter is lost to the system. The tunable bandpass filter can be tuned, using the filter controller, to pass a wavelength band over a range of wavelengths. For example, the dashed-line wavelength band 52 shows tuning to another possible wavelength band that could be passed instead of wavelength band 54.

Figure 5:
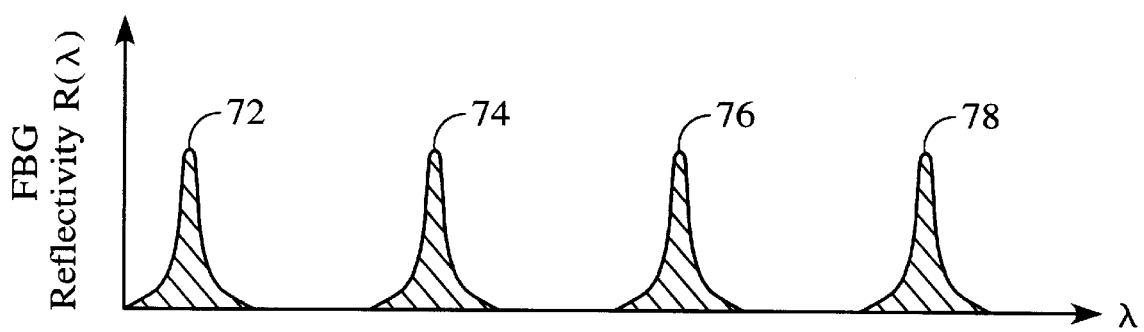
FIG. 5 illustrates wavelength bands of reflectivity corresponding to the four FBGs depicted in FIG. 2.

Referring again to FIG. 2, a second optical fiber 28 is coupled to the output of the tunable bandpass filter 26. The second optical fiber has a reflective filter which is comprised of a series of four FBGs 30, 32, 34 and 36 formed inside the fiber, with each of the FBGs in the series fixed to reflect a different wavelength band that corresponds to one of four channels of the ITU grid. FIG. 5 is a depiction of four fixed wavelength bands of reflectivity 72, 74, 76 and 78 corresponding to four fixed FBGs 30, 32, 34 and 36, respectively. Although four FBGs are shown, any number of gratings may be used for the reflective filter.

In the preferred embodiment, the FBGs are ordered along the optical fiber 28 by wavelength to reduce losses as a result of mode coupling. The FBG that reflects the shortest wavelength of optical energy is located closest to the tunable bandpass filter along the optical fiber. The FBG that reflects the next shortest wavelength of optical energy is the next closest to the tunable bandpass filter, and so on, so that the FBG that reflects the longest wavelength of optical energy is farthest from the tunable bandpass filter along the optical fiber. In FIG. 2, FBG 30 reflects the shortest wavelength of optical energy, FBG 32 reflects a longer wavelength of optical energy, FBG 34 reflects a longer wavelength of optical energy than FBGs 30 or 32, and FBG 36 reflects the longest wavelength of optical energy.

In order to use the wavelength-selectable laser system 20 to transmit optical data, an external modulator 46 with an output fiber 48, as depicted in FIG. 2, may be connected to the gain medium 22 at the surface containing the partially reflective mirror 40. The external modulator is necessary to modulate data onto the single wavelength laser light that acts as an optical carrier. The modulator may contain an isolator to prevent interference with the gain medium. Although the modulator in the preferred embodiment is external to the gain medium, the modulator can be integrated into the gain medium. For example, if the gain medium is in a planar device, the modulator can be formed on the same structure and optically coupled to the laser output so that the laser light is modulated with optical data upon output from the laser chip. In another alternative, intensity modulation can be achieved by modulating the gain of the gain medium.

Figure 6:
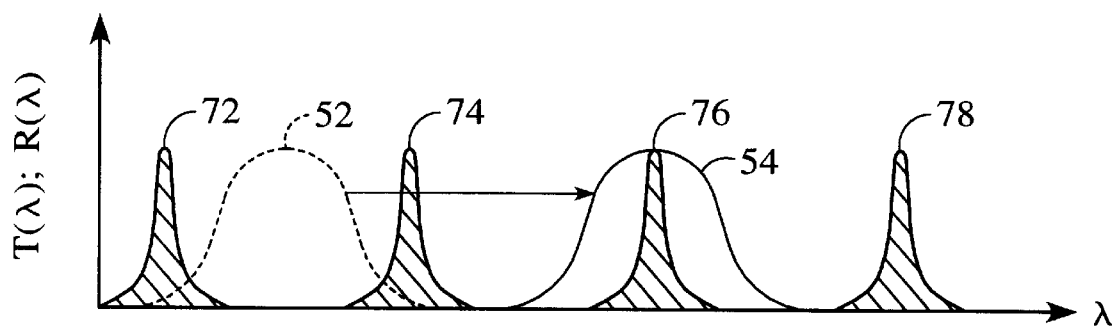
FIG. 6 illustrates the combination of the single wavelength band of optical energy of FIG. 4 and the wavelength bands of reflectivity of FIG. 5.

Operation of the preferred wavelength-selectable laser is described with reference to FIGS. 2, 3 and 6. Broadband optical energy is generated 140 by the gain medium 22. The broadband optical energy, which has a characteristic bell-shaped gain curve over a range of wavelengths, propagates through the attached optical fiber 24 and into the tunable band-pass filter 26. At the bandpass filter, the broadband optical energy is filtered 142 into optical energy having a transmission band. FIG. 6 depicts two positions of one transmission band 52 and 54 overlaid against the wavelength bands of reflectivity 72–78 of the four fixed FBGs, two of which are provided in executing steps 144 and 146 of FIG. 3. The initial position of the filtered wavelength band of optical energy is depicted by the dashed-line wavelength band 52. At the initial position, the wavelength band of optical energy that passes through the bandpass filter 26 does not correspond to any of the four wavelength bands of optical energy that are reflected by the FBGs. As a result, in the initial position none of the optical energy that is transmitted 148 to the optical fiber containing the FBGs is reflected back to the gain medium.

To cause lasing at a single selected wavelength, the filter controller 27 tunes the bandpass filter 26 so that the wavelength band that is output from the bandpass filter corresponds to one of the four FBGs 30, 32, 34 and 36. Tuning the bandpass filter shifts the wavelength band 54 to correspond to the reflected wavelength band 72 of FBG 34. FBG 34 then reflects 150 a certain percentage of the passed optical energy back through the bandpass filter and to the gain medium 22. The reflected optical energy at the selected wavelength then encounters the partially reflective mirror 40 of the gain medium and is partially reflected back to the FBG 34, creating a laser cavity. Some of the laser light is then emitted through the partially reflective mirror of the gain medium into optical fiber 44. The laser light emitted at the selected wavelength can be used in various applications. In wavelength division multiplexed applications, the single wavelength laser light is modulated to carry data such as voice conversations, computer data, and video. An advantage of the system is that the wavelength bands of reflectivity of the FBGs are fixed and, therefore, a stable, calibrated wavelength band of optical energy can be reflected.

Figure 7:
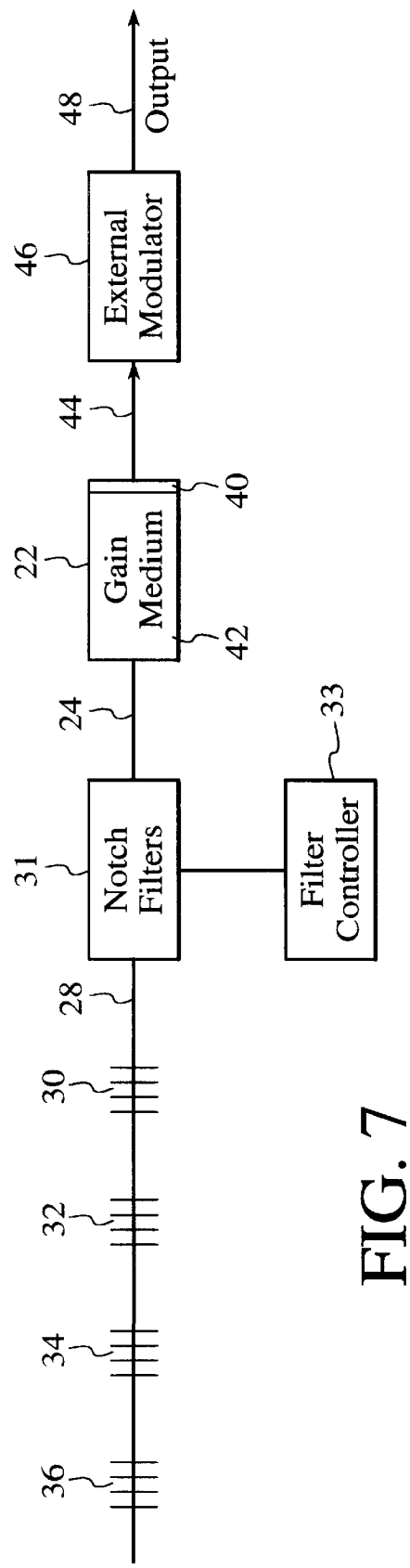
FIG. 7 is a schematic view of a wavelength-selectable linear cavity laser utilizing notch filters in accordance with the present invention.
Figure 8:
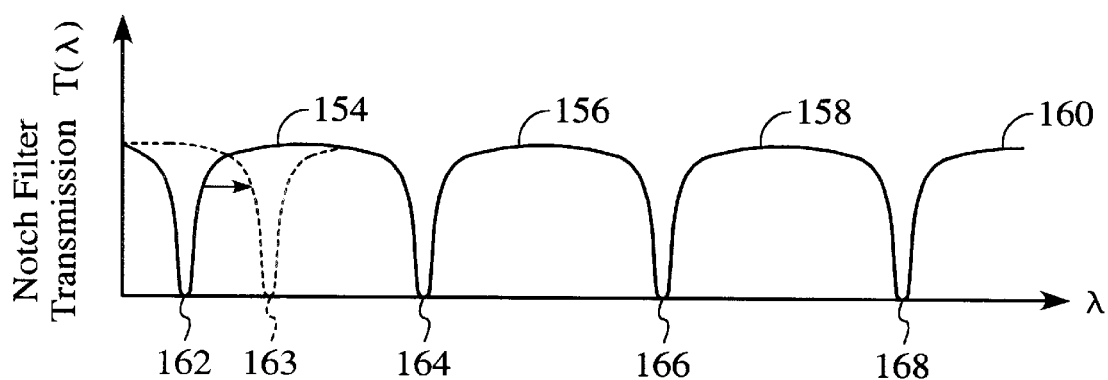
FIG. 8 illustrates filtered optical energy with wavelength bands of relatively high transmission and wavelength notches of low transmission generated from the notch filters of FIG. 7.

In alternative embodiments of the invention, the type of optical transmission filter used to filter the broadband optical energy emitted from the gain medium can be changed. In one example, referring to FIG. 7, a tunable notch filter, or series of notch filters 31, can be used to filter the broadband optical energy emitted from the gain medium. FIG. 7 has a similar component arrangement to the system of FIG. 2 and, therefore, the same reference numerals are used for similar components. The notch filters 31 are tuned by the attached filter controller 33. A notch filter is a filter that passes a wide bandwidth of optical energy while preventing a narrow bandwidth of optical energy from passing. Referring to FIG. 8, a series of four notch filters generates an optical energy transmission curve that has relatively high transmission bands 154, 156, 158 and 160 over a range of wavelengths and four relatively low transmission "notches" 162, 164, 166 and 168. The notches of low transmission can be changed as represented by the shift in wavelength band that is possible from the solid-line notch 162 to the dashed-line notch 163.

Figure 9:
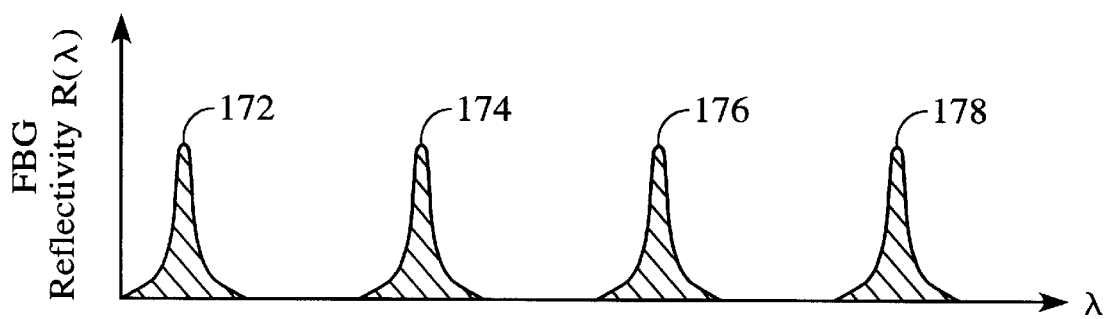
FIG. 9 illustrates wavelength bands of reflectivity corresponding to the four FBGs depicted in FIG. 7.

FIG. 9 is equivalent to FIG. 5 in that it represents the wavelength bands of optical energy 172, 174, 176 and 178 that are reflected by FBGs 30, 32, 34 and 36, respectively. In the embodiment, the wavelength bands of reflectivity are not adjustable. However, embodiments utilizing tunable FBGs are possible.

Operation of the system of FIG. 7 is described with reference to FIG. 10, which depicts the optical energy transmission of the notch filters in two states overlaid against the wavelength bands of reflectivity 172–178 of the four FBGs 30, 32, 34 and 36. The initial distribution of the optical energy output by the notch filters is represented by the dashed-line notch 163 and the solid-line notches 164, 166 and 168. In the initial position, minimal optical energy is being transmitted to the FBGs at the wavelength bands of optical energy that the FBGs reflect. As a result, no optical energy is being reflected back to the gain medium 22.

Figure 10:
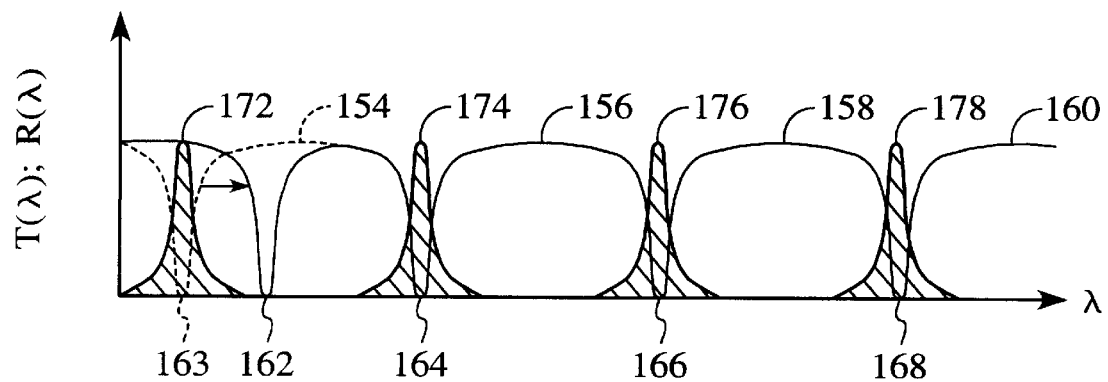
FIG. 10 illustrates the combination of notch filtered optical energy of FIG. 8 and the wavelength bands of reflectivity of FIG. 9.

To lase a desired wavelength, referring to FIG. 10 a notch filter is tuned from the dashed-line notch 163 position to the solid-line notch 162 position. As a result of interaction between the optical energy and the FBG, the optical energy at the wavelength band of reflectivity of the FBG is reflected back to the gain medium, enabling the gain medium to lase at the desired wavelength.

Figure 11:
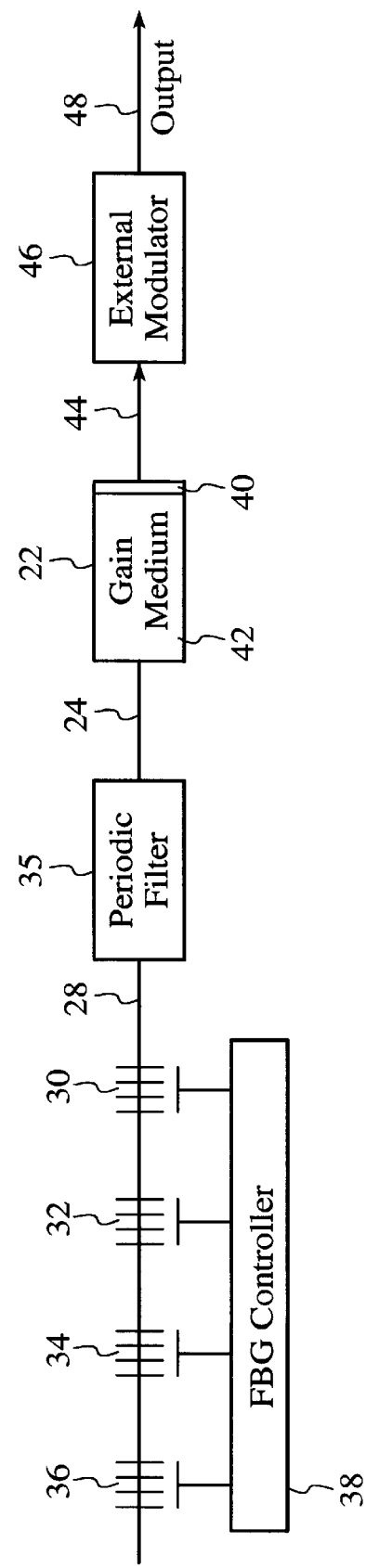
FIG. 11 is a schematic view of a wavelength-selectable linear cavity laser utilizing a periodic filter in accordance with the present invention.
Figure 12:
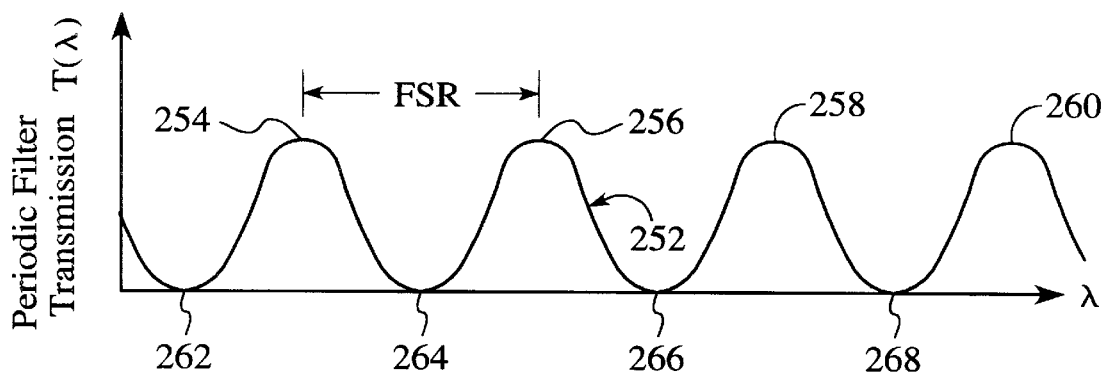
FIG. 12 illustrates periodic optical energy as a function of wavelength generated from the periodic filter of FIG. 11.

In another embodiment of the invention, a periodic filter is used as the optical transmission filter. FIG. 11 represents a system using a periodic transmission filter and again similar components are numbered as in FIG. 2. The periodic transmission filter 26 is a conventional periodic filter, such as a tapered fiber filter or a Mach-Zehnder filter. The purpose of the periodic filter is to transform the broadband optical energy that is generated by the gain medium 22 into optical energy having an intensity that varies with wavelength in a periodic fashion. Referring to FIG. 12, filtered broadband optical energy has a periodic optical energy distribution 252 with a series of four periodic transmission peaks 254, 256, 258 and 260 and four periodic transmission nulls 262, 264, 266 and 268. In the preferred embodiment, the free spectral range (FSR), or optical distance between transmission peaks, is approximately 100 GHz (0.8 nm). Moreover, in the preferred embodiment, the transmission peaks correspond to the wavelength bands of channels designated by the ITU. Filtering the broadband optical energy in accordance with the ITU grid provides a laser that is well suited for lightwave communications systems. Although four wavelength bands of channels are shown, any number of channels can be accommodated.

Figure 13:
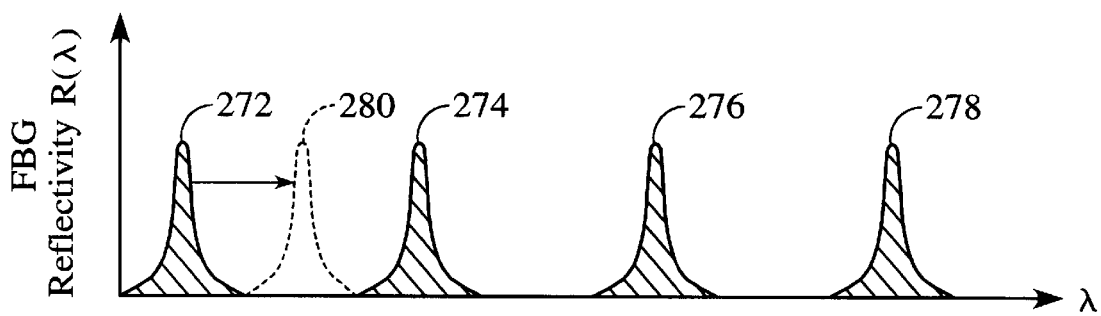
FIG. 13 illustrates wavelength bands of reflectivity corresponding to the four FBGs depicted in FIG. 11.

Referring again to FIG. 11, a second optical fiber 28 is coupled to the output of the periodic filter 35. The second optical fiber has a series of four tunable FBGs 30, 32, 34 and 36 formed inside the fiber, with each of the FBGs in the series reflecting a different wavelength band of optical energy that corresponds to one of the four channels of the ITU grid. Each FBG has a normal state and a tuned state and is controlled by an FBG controller 38. The FBG controller is a conventional controller and is not critical to the invention. In the normal or "parked" state, an FBG is not being mechanically or thermally tuned to a transmission peak and the FBG reflects optical energy in a wavelength band where minimal optical energy is being transmitted through the periodic filter. FIG. 13 is a depiction of four parked wavelength bands of reflectivity 272, 274, 276 and 278 corresponding to four parked FBGs 30, 32, 34 and 36, respectively. Tuning the FBGs with mechanical and/or thermal influences will change the wavelength band of optical energy that is reflected by the FBGs. As known in the art, thermal tuning can typically cause a 0.01 nm change in a wavelength band of reflectivity of an FBG for each 1° C. change in temperature over a range of 80° C., allowing approximately 0.8 nm of adjustability.

The dashed-line wavelength band 280 in FIG. 13 is a depiction of a possible reflective wavelength band representing the first FBG 30 in a tuned position while the three other FBGs remain in their same parked positions 274, 276 and 278. FBGs in the preferred embodiment have a tuning range of 0.8 nm but only need to be tuned over one-half of a channel spacing (0.4 nm), which is equivalent to the wavelength range from a transmission null 262 to an adjacent transmission peak 254 in FIG. 12. Although four FBGs are depicted, any number of FBGs can be used, and preferably the number of FBGs corresponds directly to the number of channels that the laser system is capable of emitting.

The four FBGs 30, 32, 34 and 36 are normally parked at the transmission nulls of the periodic optical energy because minimal optical energy is being transmitted at the nulls. Ideally, the FBGs have no optical energy to reflect and therefore generate no interference in the laser cavity. However, the FBGs can be individually tuned, causing their wavelength bands of reflectivity to change to the adjacent transmission peaks. Since there is significant optical energy at the transmission peaks, an FBG will reflect the optical energy that falls within the tuned FBG's wavelength band of reflectivity.

Figure 14:
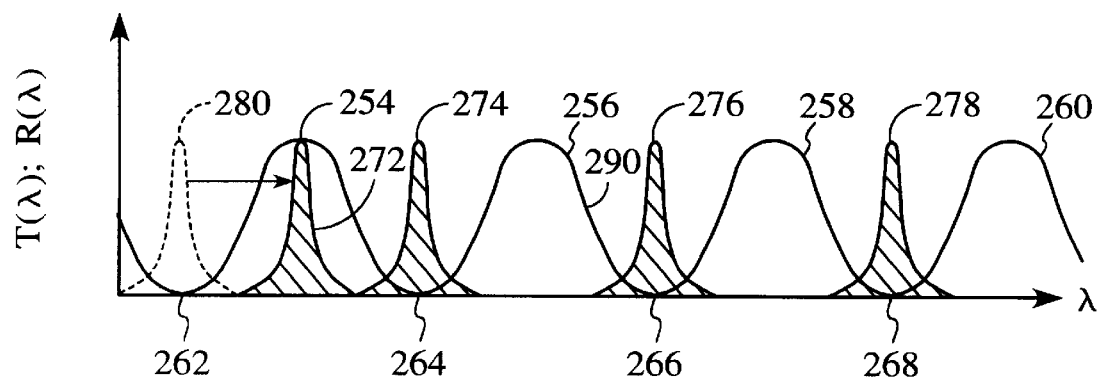
FIG. 14 illustrates the combination of the periodic optical energy FIG. 12 and the wavelength bands of reflectivity of FIG. 13.

Operation of the wavelength-selectable laser is described with reference to FIGS. 11 and 14. Broadband optical energy is generated by the gain medium 22. The broadband optical energy, which has a characteristic bell-shaped gain curve over a range of wavelengths, propagates through the attached optical fiber 24 and into the periodic filter 35. At the periodic filter, the broadband optical energy is filtered into periodic optical energy having alternating transmission peaks and transmission nulls. FIG. 14 depicts the transmission of periodic optical energy 290 having four transmission peaks 254, 256, 258 and 260 and four transmission nulls 262, 264, 266 and 268 overlaid against the wavelength bands of reflectivity 280, 274, 276 and 278 of the four parked FBGs. The dashed-line wavelength band represents the initial parked position of an FBG and the solid-line wavelength band 272 represents the tuned position of the same FBG. The transmission peaks correspond to the optical channels in a lightwave communications system, and the transmission nulls allow gaps in the optical energy transmission where FBGs can be parked without causing unwanted feedback to the laser cavity. The four FBGs 30, 32, 34 and 36 are initially parked at each of the transmission nulls 262, 264, 266 and 268 of the periodic optical energy and, therefore, minimal optical energy is reflected back to the gain medium.

To cause lasing at a single selected wavelength, the periodic optical energy output from the periodic filter 35 is transmitted through the optical fiber 28 containing the four FBGs 30, 32, 34 and 36 and the FBG corresponding to the selected laser wavelength is tuned. Tuning the FBG shifts the wavelength band of reflectivity, represented by the solid-line wavelength band 272, and causes the FBG to reflect a predetermined percentage of the optical energy at the transmission peak 254 back through the periodic filter and to the gain medium 22. The reflected optical energy at the selected wavelength then encounters the partially transmissive mirror 40 of the gain medium and is partially reflected back to the tuned FBG to create a laser cavity.

In an alternative embodiment of the laser system, the optical transmission filter, whether it be a bandpass filter, a notch filter, or a periodic filter, can be integrated with the gain medium. For example, when the gain medium is formed on a planar substrate, an optical transmission filter, such as a Mach-Zehnder filter, can be formed on the same planar substrate and optically connected to the light energy generated by the gain medium. An integrated gain medium/periodic filter outputs periodic optical energy directly to a series of Bragg gratings that are formed in an optical fiber. Integrating the periodic filter with the gain medium can reduce return losses from the periodic filter by eliminating the coupling points between the periodic filter and the optical fiber.

Figure 15:
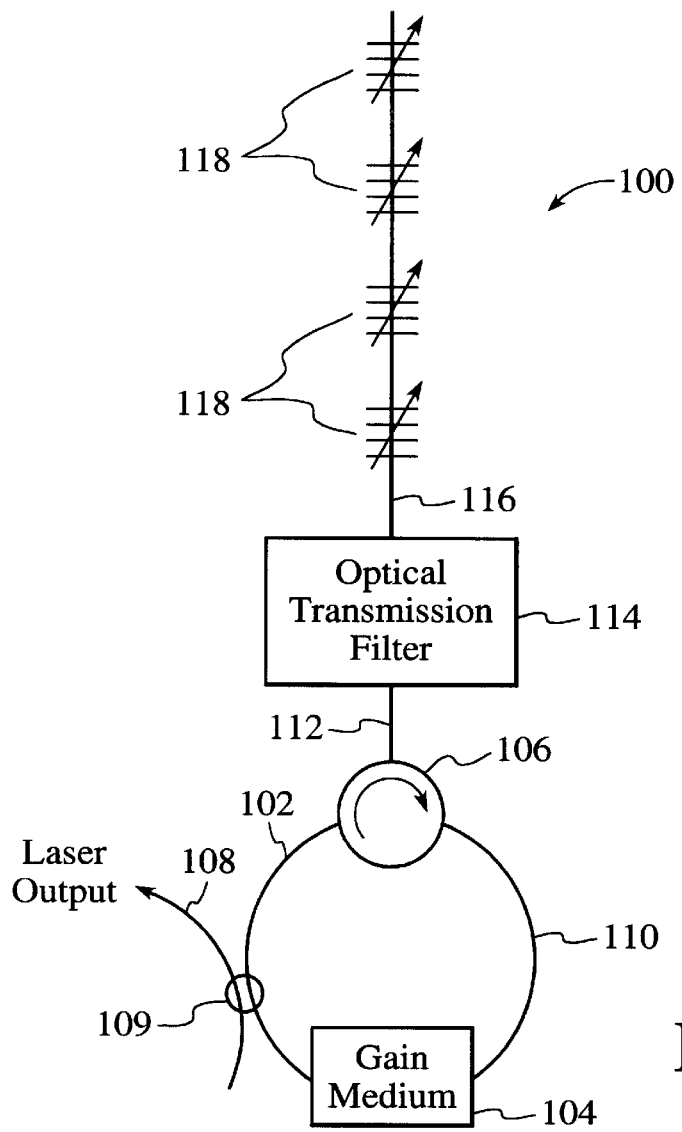
FIG. 15 is a schematic view of a wavelength-selectable ring cavity laser in accordance with a second embodiment of the present invention.

Although the preferred embodiment describes a linear cavity laser, other configurations of laser cavities can be used. FIG. 15 is an example of a ring cavity laser 100 in accordance with the present invention. The ring cavity laser has a first optical fiber 102 coupled to the output of a gain medium 104 and the input port of a three-port circulator 106. The first optical fiber is also coupled to a laser output fiber 108 by a coupler 109 between the gain medium and the circulator. The output port of the circulator is connected to a second optical fiber 110 that is coupled to the input of the gain medium, creating an optical fiber loop. The third port of the circulator is a filter port. An optical fiber 112 coupled to the filter port connects the circulator to the optical transmission filter 114 and an optical fiber 116 that contains a series of tunable FBGs 118.

Operation of the ring cavity laser 100 is similar to that of the linear cavity laser. The gain medium 104 generates broadband optical energy that is output into the first optical fiber 102 of the optical fiber loop and transmitted to the circulator 106. The circulator transmits the broadband optical energy to the optical transmission filter and to the FBGs which work in concert as described above to reflect a desired wavelength band of optical energy back to the circulator. The desired wavelength band of optical energy that is reflected back to the circulator is then introduced into the second optical fiber 110 by the circulator and transmitted to the gain medium, thereby completing a full transmission loop in the ring cavity. Inserting the desired wavelength band of optical energy into the ring cavity causes the optical energy in the ring cavity to reach an intensity to lase at the desired wavelength. Laser light with the desired wavelength can then be output through the output fiber and utilized in applications such as lightwave communications.

Figure 16:
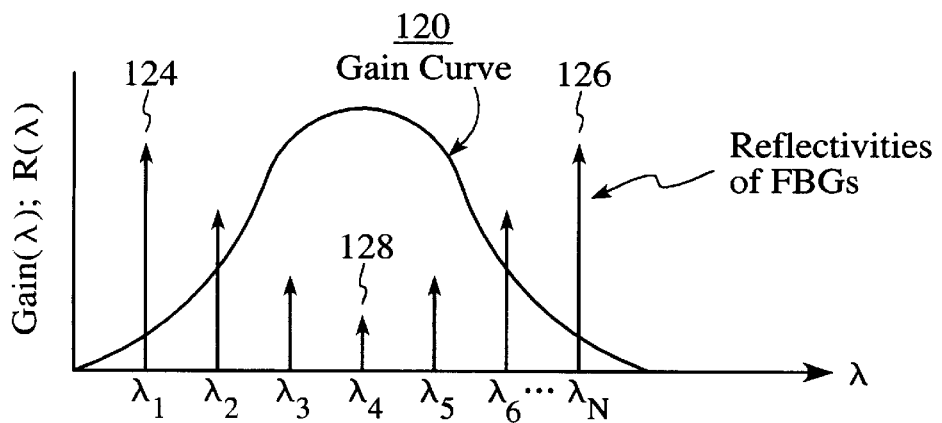
FIG. 16 is a depiction of an exemplary gain curve compared to the reflectivity strengths of a series of FBGs.

FIG. 16 represents a typical gain curve 120 of a gain medium. The distribution of optical energy has a wavelength range of approximately 30 nm and the gain is typically not evenly distributed. As described above, different FBGs are formed to reflect different ranges of wavelength bands. To create lasing in the laser cavity, it is desirable to reflect a constant intensity of optical energy back to the gain medium regardless of wavelength. If each FBG has equivalent reflective power, then the FBGs at the low energy ends 124 and 126 of the gain curve 120 will reflect less optical energy than the FBG at the peak 128 of the gain curve. To deliver a constant amount of optical energy into the laser cavity, the reflective powers of the FBGs are set to compensate for the gain curve variations. That is, the reflective powers of the FBGs, as depicted by the up arrows in FIG. 16, are higher at the low energy ends of the gain curve and lower at the peak of the gain curve. By establishing the inverse relationship between gain and reflective power, balanced optical energy reflection can be achieved. That is, laser light intensity is no longer dependent upon wavelength, thereby allowing the same pumping level to be used at each lasing wavelength.

What is claimed is:

1. A wavelength selectable laser comprising:
    a source of optical energy within a range of wavelengths;
    optical transmission filter means optically connected to said source for filtering said optical energy as a function of wavelength;
    grating means for reflecting a wavelength band of optical energy within said range of wavelengths, said grating means being optically connected to said optical filter means to receive said filtered optical energy; and
    tuning means for tuning one of said optical filter means and said grating means such that said filtered optical energy at a selected wavelength band from within said range of wavelengths is reflected by said grating means;
    said source being optically coupled with respect to said grating means to receive said reflected optical energy at said selected wavelength band to induce lasing at said selected wavelength band.

2. The laser of claim 1 wherein said optical filter means includes a tunable bandpass filter having high optical energy transmissivity over an adjustable wavelength band.

3. The laser of claim 2 wherein said grating means includes a plurality of gratings, each grating reflecting a unique and fixed wavelength band of optical energy, said tunable bandpass filter being adjustable over a range of wavelengths that includes said unique and fixed wavelength bands of optical energy reflected by said plurality of gratings.

4. The laser of claim 1 wherein said optical filter means includes a plurality of notch filters, each notch filter reflecting a wavelength band of optical energy.

5. The laser of claim 4 wherein said grating means includes a plurality of gratings, each grating reflecting a unique wavelength band of optical energy.

6. The laser of claim 5 wherein each one of said plurality of notch filters is adjustable with respect to said wavelength band of optical energy that is reflected.

7. The laser of claim 5 wherein each one of said plurality of gratings is adjustable with respect to said unique wavelength band of optical energy that is reflected.

8. The laser of claim 1 wherein said optical filter means includes a periodic filter having an alternating pattern of transmission nulls and transmission peaks.

9. The laser of claim 8 wherein said grating means includes:
    a first tunable grating having a first condition in which light energy at a wavelength band associated with a first transmission null is reflected and a second condition in which light energy at a wavelength band associated with a first transmission peak is reflected; and
    a second tunable grating having a first condition in which light energy at a wavelength band associated with a second transmission null is reflected and a second condition in which light energy at a wavelength band associated with a second transmission peak is reflected.

10. The laser of claim 9 wherein said tuning means includes a tuner having individual connections to said first tunable grating and said second tunable grating, said individual connections outputting signals that control whether said first tunable grating is in said first condition or said second condition and whether said second tunable grating is in said first condition or said second condition.

* * * * *